US009957780B2

(12) United States Patent
Knecht et al.

(10) Patent No.: US 9,957,780 B2
(45) Date of Patent: May 1, 2018

(54) OILFIELD DATA ANALYTICS AND DECISION WORKFLOW SOLUTION

(71) Applicant: Baker Hughes Incorporated, Houston, TX (US)

(72) Inventors: William N. Knecht, Houston, TX (US); David W. Green, Richmond, TX (US); Charles D. Shearin, Houston, TX (US); Robert Louis Kennedy, Houston, TX (US)

(73) Assignee: BAKER HUGHES, A GE COMPANY, LLC, Houston, TX (US)

( * ) Notice: Subject to any disclaimer, the term of this patent is extended or adjusted under 35 U.S.C. 154(b) by 193 days.

(21) Appl. No.: 14/814,042

(22) Filed: Jul. 30, 2015

(65) Prior Publication Data
US 2016/0034818 A1 Feb. 4, 2016

Related U.S. Application Data

(60) Provisional application No. 62/032,450, filed on Aug. 1, 2014.

(51) Int. Cl.
*E21B 41/00* (2006.01)
*G06F 19/00* (2018.01)
(Continued)

(52) U.S. Cl.
CPC .............. *E21B 41/00* (2013.01); *E21B 47/00* (2013.01); *G06F 17/50* (2013.01); *G06F 19/00* (2013.01); *G06G 7/48* (2013.01); *G06Q 50/02* (2013.01)

(58) Field of Classification Search
CPC ......... E21B 41/00; E21B 47/00; G06Q 50/02; G06F 19/00; G06F 17/50; G06G 7/48
See application file for complete search history.

(56) References Cited

U.S. PATENT DOCUMENTS 9,024,778 B2 * 5/2015 Winkler ................. G08C 19/00
175/40
2009/0225630 A1 * 9/2009 Zheng ...................... G01V 1/42
367/81

(Continued)

OTHER PUBLICATIONS

Ainakhli, et al.; Automated Workflow for Real-Time Management in a Large Carbonate Field; SPE-174809; 2015; Society of Petroleum Engineers; 15 pages.

(Continued)

*Primary Examiner* — Yong-Suk Ro
(74) *Attorney, Agent, or Firm* — Cantor Colburn LLP

(57) ABSTRACT

A method for presenting oilfield data to a user includes: searching a plurality of oilfield data sources for raw oilfield data; applying an algorithm as needed to the raw oilfield data; providing a quality control check on the oilfield data; deleting any oilfield data that does not pass the quality control check; tagging oilfield data that passes the quality control check with one or more searchable identifiers; storing any oilfield data that passes the quality control check and associated one or more identifiers in a storage medium; receiving a request for specified oilfield data from a user; searching identifiers in the storage medium to identify the specified oilfield data; and sending the identified specified oilfield data in the storage medium to the user. The method may also include planning an oilfield action using the specified oilfield data and implementing the planned oilfield action using oilfield equipment.

20 Claims, 10 Drawing Sheets

(51) Int. Cl.
 *G06G 7/48* (2006.01)
 *E21B 47/00* (2012.01)
 *G06Q 50/02* (2012.01)
 *G06F 17/50* (2006.01)

(56) References Cited

U.S. PATENT DOCUMENTS

| | | |
|---|---|---|
| 2010/0042458 A1 | 2/2010 | Rashid et al. |
| 2010/0235101 A1* | 9/2010 | Aamodt ............... E21B 44/00 702/9 |
| 2011/0071963 A1* | 3/2011 | Piovesan ............... G06Q 10/00 706/11 |
| 2011/0077924 A1 | 3/2011 | Eratas et al. |
| 2012/0054270 A1* | 3/2012 | Foreman ............... G06Q 50/02 709/203 |
| 2012/0316789 A1 | 12/2012 | Rivera et al. |
| 2013/0083031 A1* | 4/2013 | Lehnherr ............... G06Q 50/02 345/440 |
| 2013/0232158 A1 | 9/2013 | Heggelund et al. |
| 2014/0067353 A1 | 3/2014 | Shelley et al. |
| 2015/0365635 A1* | 12/2015 | Jose ....................... H04N 7/185 348/14.07 |

OTHER PUBLICATIONS

Notification of Transmittal of the International Search Report and the Written Opinion of the International Searching Authority, or the Declaration; PCT/2015US/043045; dated Oct. 26, 2015; 8 pages.

* cited by examiner

OILFIELD DATA ANALYTICS AND DECISION WORKFLOW SOLUTION

CROSS REFERENCE TO RELATED APPLICATIONS

This application claims the benefit of an earlier filing date from U.S. Provisional Application Ser. No. 62/032,450 filed Aug. 1, 2014, the entire disclosure of which is incorporated herein by reference.

BACKGROUND

Large amounts and various types of oilfield data are typically required for drilling a wellbore into a hydrocarbon-bearing geologic formation, running the wellbore completion, stimulating the formation, and producing and recording daily rates and cumulative volumes of hydrocarbons via the wellbore. Unfortunately, gathering the required data can be time consuming requiring days or even weeks in some cases. Hence, a significant increase in speed for providing quality oilfield data to users for decision making and thus improving workflow would be well received in the drilling and production industries.

BRIEF SUMMARY

Disclosed is a method for presenting oilfield data to a user. The method includes searching a plurality of oilfield data sources for oilfield data; receiving the oilfield data in raw form from the plurality of oilfield data sources; determining if the oilfield data in raw form requires application of an algorithm; identifying the oilfield data in raw form as non-calculated oilfield data if an algorithm does not have to be applied; applying the algorithm to the oilfield data in raw form to provide calculated oilfield data if it is determined that the algorithm is required to be applied to the oilfield data in raw form; providing a quality control check on the non-calculated oilfield data and the calculated oilfield data; deleting any non-calculated oilfield data and/or any calculated oilfield data that does not pass the quality control check; tagging any non-calculated oilfield data and/or any calculated oilfield data that passes the quality control check with one or more identifiers that are searchable; storing any non-calculated oilfield data and/or any calculated oilfield data that passes the quality control check and associated one or more identifiers in a storage medium; receiving a request for specified oilfield data from a user using a user interface; searching identifiers in the storage medium to identify the specified oilfield data; sending the identified specified oilfield data from the non-calculated oilfield data, the calculated oilfield data, or some combination thereof stored in the storage medium to the user interface; planning an oilfield action using the specified oilfield data; and implementing the planned oilfield action using oilfield equipment; wherein the searching, receiving requested oilfield data, determining, identifying, applying, providing, deleting, tagging, storing, receiving a request, searching, sending, and planning are implemented by a processor.

Also disclosed is a non-transitory computer readable medium having computer executable instructions for presenting oilfield data to a user. The computer executable instructions when executed by a processor cause an apparatus to implement a method that includes: searching a plurality of oilfield data sources for oilfield data; receiving the oilfield data in raw form from the plurality of oilfield data sources; determining if the oilfield data in raw form requires application of an algorithm; identifying the oilfield data in raw form as non-calculated oilfield data if an algorithm does not have to be applied; applying the algorithm to the oilfield data in raw form to provide calculated oilfield data if it is determined that the algorithm is required to be applied to the oilfield data in raw form; providing a quality control check on the non-calculated oilfield data and the calculated oilfield data; deleting any non-calculated oilfield data and/or any calculated oilfield data that does not pass the quality control check; tagging any non-calculated oilfield data and/or any calculated oilfield data that passes the quality control check with one or more identifiers that are searchable; storing any non-calculated oilfield data and/or any calculated oilfield data that passes the quality control check and associated one or more identifiers in a storage medium; receiving a request for specified oilfield data from a user using a user interface; searching identifiers in the storage medium to identify the specified oilfield data; sending the identified specified oilfield data from the non-calculated oilfield data, the calculated oilfield data, or some combination thereof stored in the storage medium to the user interface; planning an oilfield action using the specified oilfield data; and implementing the planned oilfield action using oilfield equipment.

BRIEF DESCRIPTION OF THE DRAWINGS

The following descriptions should not be considered limiting in any way. With reference to the accompanying drawings, like elements are numbered alike.

DETAILED DESCRIPTION

A detailed description of one or more embodiments of the disclosed apparatus and method presented herein by way of exemplification and not limitation with reference to the figures.

Disclosed is method and apparatus for increasing speed for providing oilfield data to a user. By increasing the speed, efficiency of workflow for various oilfield operations can be improved. Workflow may include analyzing the oilfield data, decision making based on the analyzed oilfield data, planning for future wells, stimulation treatments such as hydraulic fracturing, production operations and possibly refracturing a well in the future. Workflow may also include performing oilfield actions to implement oilfield plans resulting from the planning. Non-limiting embodiments of the oilfield data include an oilfield system, an apparatus in the system, a device in the apparatus, a component in the device, a performance value of the system, a performance value of the apparatus, a performance value of the device, a performance value of the component, a drilling parameter, a drilling performance value associated with using the drilling parameter, a formation stimulation parameter, a formation stimulation performance value associated with using the formation stimulation parameter, a production parameter, a production performance value associated with using the production parameter, a name of an earth formation of interest, a well in the earth formation of interest, a location of the earth formation of interest, and logging data (e.g., resistivity, acoustic, gamma ray, neutron, nuclear magnetic resonance) for a well of interest. Further non-limiting embodiments of the oilfield data include well geometry, casing and tubulars in a well of interest, well location, completion type for a well of interest, stimulation data for a well of interest, cementing parameters, permitting data for a well of interest, court filings for a well of interest, lease filings, state well maps, production data (e.g., total production and production by month), test data for a well of interest (including pressure and temperature data where reported), laboratory test reports, and job files (e.g., internal files of job data and client files of job data). Non-limiting embodiments of analytics include production analysis to include initial and total, decline curve, service interruption, and visualization of geospatial positioning of wells with completion type and production overlay of a production map. Analytics may also include performing a statistical analysis on oilfield data such as calculating an average value, a mean value and/or a ranking according to a specified criterion (e.g., production).

Figure 1:
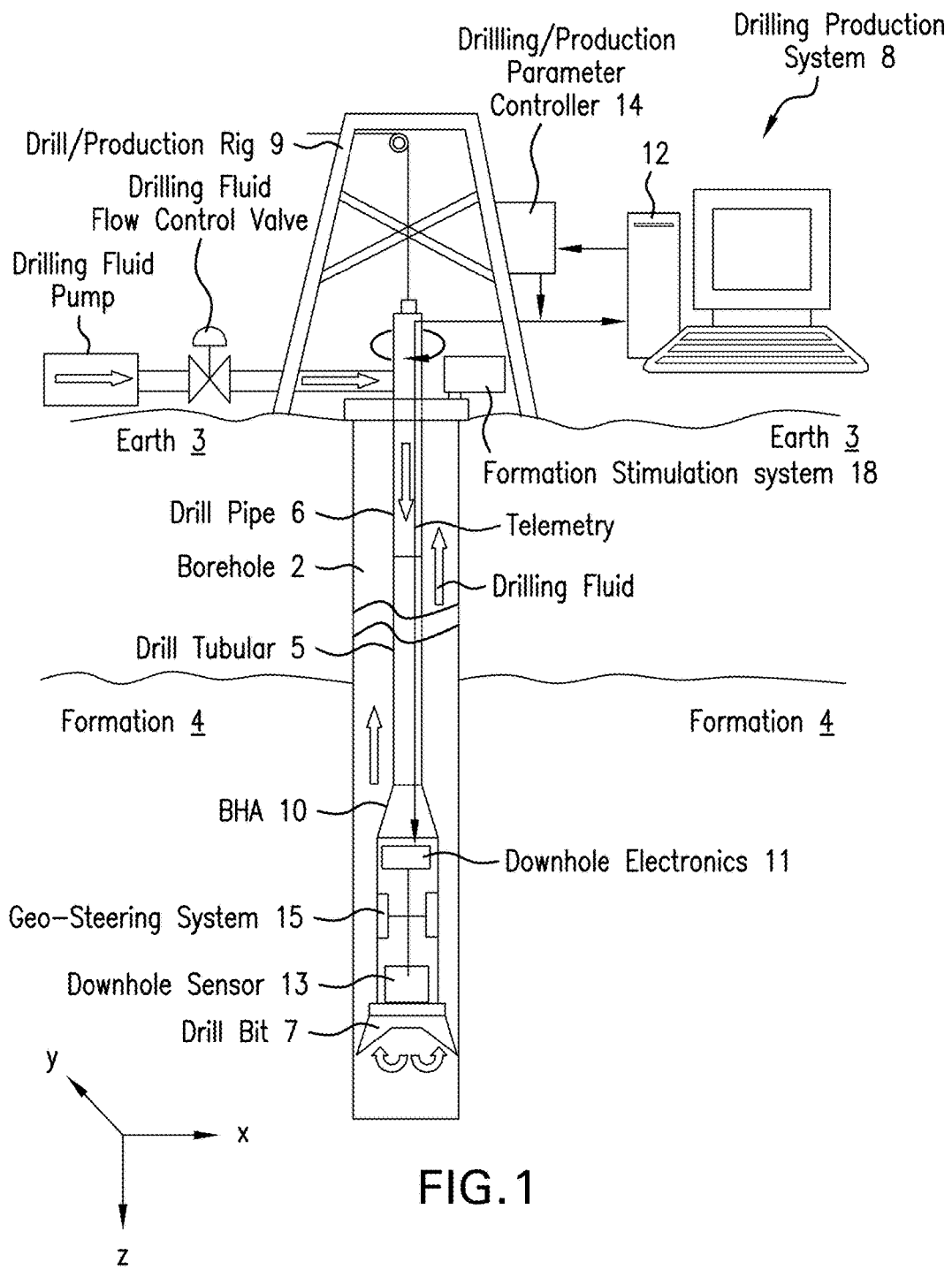
FIG. 1 depicts aspects of a drilling and subsequent production system for producing hydrocarbons via the same borehole.

Apparatus for oilfield operations related to this disclosure are now discussed. FIG. 1 is a cross-sectional view of a borehole 2 (may also be referred to as a well) penetrating the earth 3, which includes a formation 4. The formation 4 includes a reservoir of hydrocarbons, which can be oil, gas or combination thereof. A drilling/production system 8 includes a drill/production rig 9 that is configured to drill the borehole 2, stimulate the formation 4 for hydrocarbon production, run mechanical wellbore completion (e.g., install casing, tubing packers, sleeves) for hydrocarbon production, and/or extract hydrocarbons from the formation 4 via the borehole 2. A drill bit 7 is disposed at the distal end of a drill tubular 5 for drilling the borehole 2. The drill tubular 5 may be a drill string made up of a plurality of connected drill pipes 6. Drilling fluid or mud is pumped through the drill tubular 5 to lubricate the drill bit 7 and flush cuttings from the borehole 2. The drilling fluid is pumped by a drilling fluid pump and a flow rate of the drill fluid is controlled by a drilling fluid control valve. The drilling fluid pump and flow control valve may be controlled by a drilling/production parameter controller 14 to maintain a suitable pressure and flow rate to prevent the borehole 2 from collapsing. The drilling/production parameter controller 14 is configured to control, such as by feedback control for example, parameters of oilfield equipment used to drill the borehole 2, stimulate the formation 4, and/or extract hydrocarbons via the borehole 2. Suitable flow rate for extraction may be determined from knowing the porosity of the formation rock. Formation properties needed to adequately control drilling parameters may be obtained from a data center discussed below. Control setpoints may be transmitted to the drilling/production parameter controller by a computer processing system 12.

The drill tubular 5 includes a bottomhole assembly (BHA) 10. The BHA 10 includes a downhole sensor 13 configured for sensing various downhole properties or parameters related to the formation 4, the borehole 2, and/or position of the BHA 10. Sensor data may be transmitted to the surface by telemetry for processing such as by the computer processing system 12. Sensed data may be correlated to a depth at which the data was sensed to provide a log, which may be stored in the data center. The BHA 10 may also include a geo-steering system 15. The geo-steering system 15 is configured to steer the drill bit 7 in order to drill the borehole 2 according to a selected path or geometry. The path or geometry in general is selected to optimize hydrocarbon production from the borehole 2 and to ensure that the stress on the formation due to the borehole along the path does not exceed the strength of the formation material as non-limiting examples. The optimized geometry may be obtained from the data center discussed below. Steering commands may be transmitted from the drilling/production parameter controller 14 to the geo-steering system 15 by the telemetry. Telemetry in one or more embodiments may include mud-pulse telemetry or wired drill pipe. Downhole electronics 11 may process data downhole and/or act as an interface with the telemetry.

The drill/production rig 9 further includes a formation stimulation system 18 configured to stimulate the formation 4 to increase the extraction rate of hydrocarbons. In one or more embodiments, the formation stimulation system 18 is configured to hydraulically fracture the formation 4. The drilling/production parameter controller 14 is configured to control parameters of the formation stimulation system 18 such as hydraulic fluid flow rate, hydraulic fracturing pressure, and location and placement of packers. Setpoints and control information for controlling parameters of the formation stimulation system 18 may be obtained from the data center discussed below by the computer processing system 12.

The drill/production rig 9 further includes the horsepower (i.e., motors) and equipment configured to run various downhole equipment (e.g., tubulars, packers, sleeves and other components) for mechanical wellbore completion and production oilfield equipment configured for production of hydrocarbons via the borehole 2. In one or more embodiments, the production oilfield equipment includes one or more pumps and valves (not shown) configured to pump and control flow of hydrocarbons from the borehole 2. The drilling/production parameter controller 14 is configured to control production parameters such a pump speed and valve position. Setpoints and control information for controlling production oilfield equipment may be obtained from the data center discussed below by the computer processing system 12.

Figure 2:
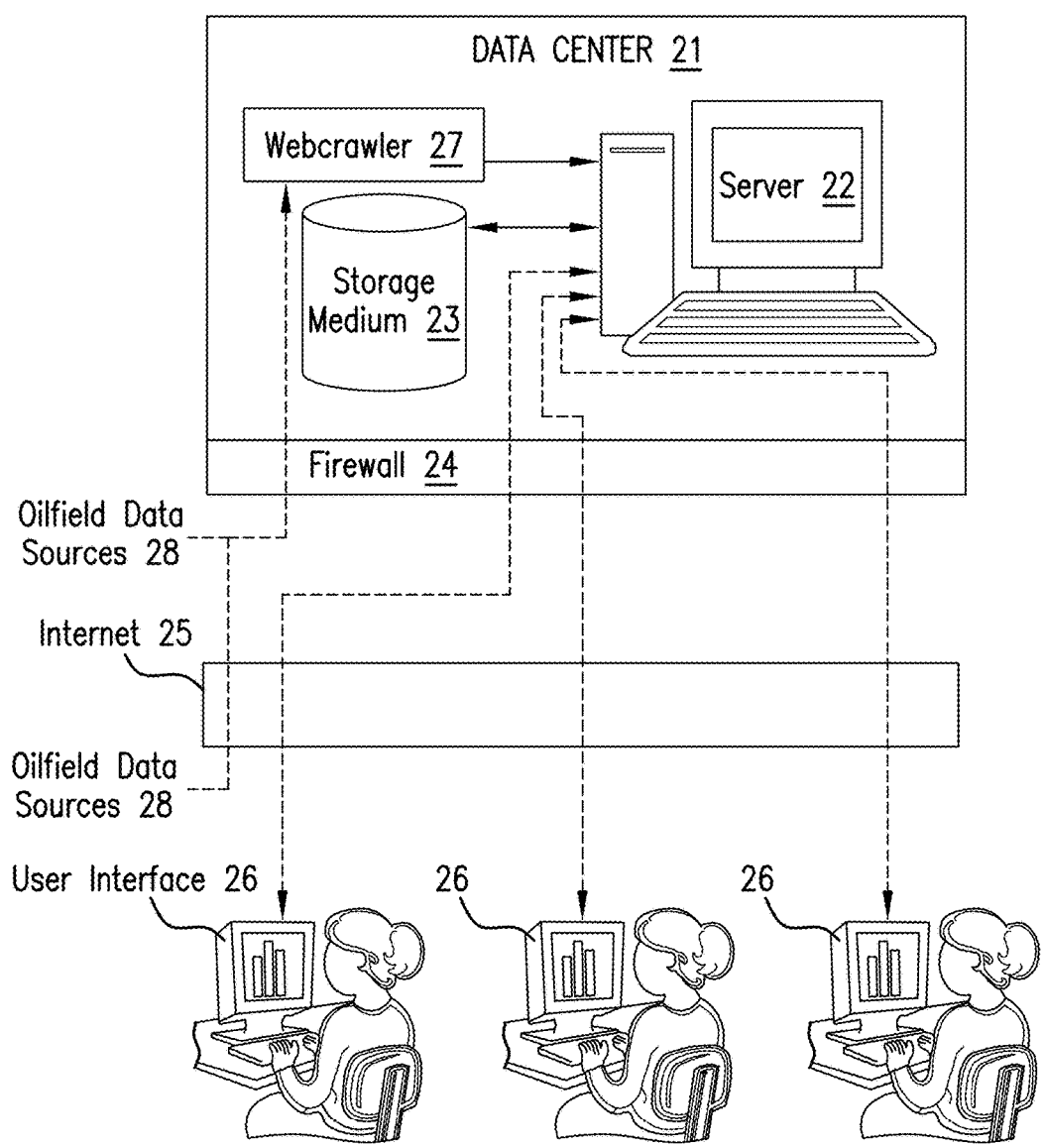
FIG. 2 depicts aspects of an overview of an oilfield data system.

FIG. 2 depicts aspects of an overview of an oilfield data system 20. The oilfield data system 20 includes a data center 21. The data center includes a server 22, a storage medium 23 and a webcrawler 27. The webcrawler 27 is configured to automatically search for and download oilfield data of interest at selected oilfield data cites 28 on a recurring basis at selected time intervals. The oilfield data cites 28 may be publically accessible websites, subscription websites, internal websites, and other data centers both internal and external to a user operating the oilfield data system 20. The oilfield data cites 28 may be accessed via internet 25 or another communications network. Downloaded oilfield data is received through a firewall 24 and is processed and stored in the storage medium 23. The firewall 24 is configured as a technological barrier to prevent unauthorized or unwanted communications with the data center 21. Aspects of the webcrawler 27 and/or the computer processing system 12 may be incorporated into the server 22.

A plurality of user interfaces 26 may be in communication with the data center 21 via internet 25. Non-limiting embodiments of a user interface 26 include a desktop computer, a laptop computer, a computer tablet, and a mobile device such as a smart phone. The user interface 26 is configured to send a request for specified oilfield data to the data center 21 and to receive the specified oilfield data in response to the request. The received specified oilfield data may be displayed to a user or stored at the user interface 26. Further, the specified oilfield data may be used to plan an oilfield action at the user interface 26 or at some other processing system such as the computer processing system 12. In addition, the specified oilfield data may be transmitted directly to the drilling/production parameter controller 14 for automatically controlling drilling parameters or via the computer processing system 12, which may further process the specified oilfield data to compute suitable drilling production parameters.

Figure 3A:
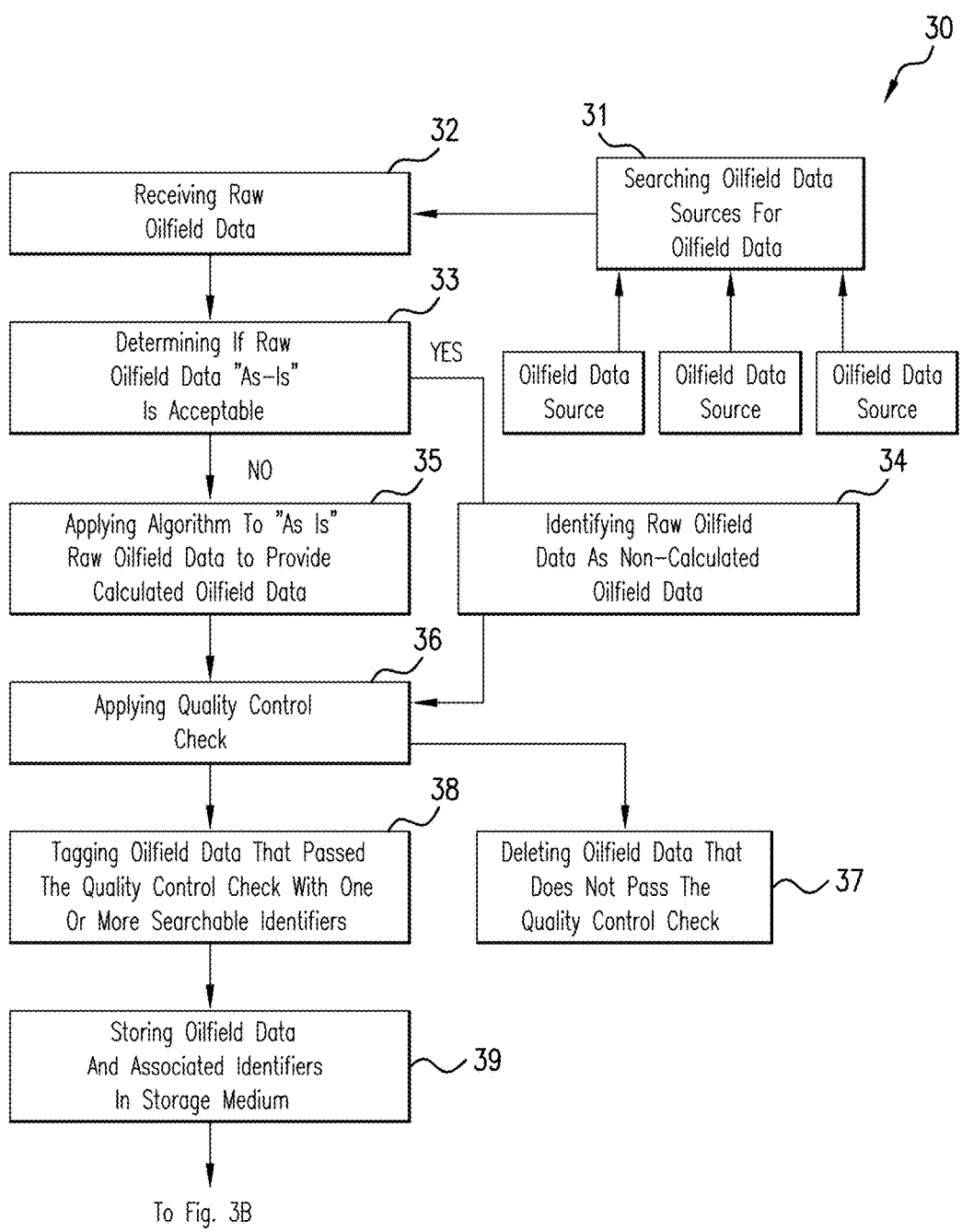
FIGS. 3A and 3B, collectively referred to as FIG. 3, present a flow chart for a method for presenting oilfield data to a user.
Figure 3B:
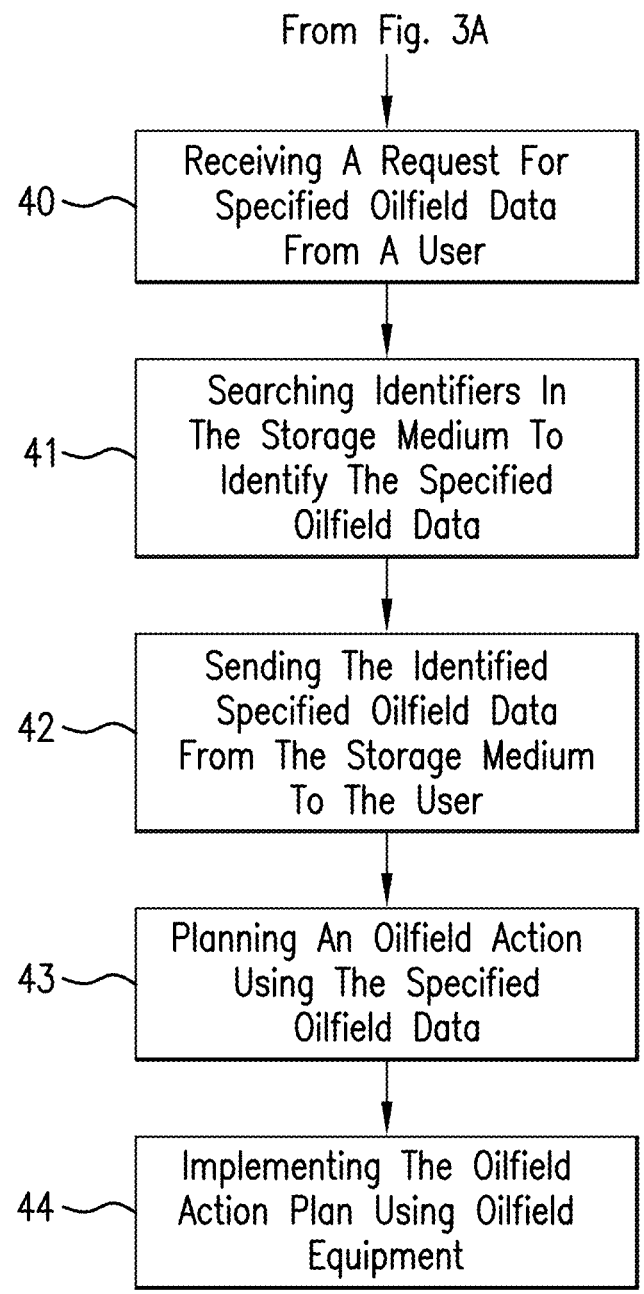

FIG. 3 is a flowchart for a method 30 for presenting oilfield data to a user. Block 31 calls for searching a plurality of oilfield data sources for oilfield data. The oilfield data sources may be public websites, private websites, subscription websites, and other data sites, such as proprietary sites, not accessed through the internet. In one of more embodiments, the searching and downloading of the certain oilfield is performed by a webcrawler or similar device or software. Block 32 calls for receiving the oilfield data in raw form from the plurality of oilfield data sources. The term "raw form" relates to data that is directly downloaded from the oilfield data source. Block 33 calls for determining if the oilfield data in raw form requires application of an algorithm. In general, application of an algorithm results in oilfield data that is of use to a user. In one or more embodiments, determining if the oilfield data in raw form requires application of an algorithm includes determining if the oilfield data in raw form meets a specified criterion for presentation to a user. The specified criterion for presentation to a user results in providing the user with the requested specified oilfield data (i.e., what the user requested). If the raw data does not meet the specified criterion, then the algorithm is applied to the raw data so that the calculated data meets the specified criterion. Block 34 calls for identifying the oilfield data in raw form as non-calculated oilfield data if an algorithm does not have to be applied. Block 35 calls for applying the algorithm to the oilfield data in raw form to provide calculated oilfield data if it is determined that the algorithm is required to be applied to the oilfield data in raw form. Non-limiting embodiments of oilfield data of interest to a user such as a reservoir engineer include average lateral inclination, lateral length, total stimulated length, gas-oil ratio, production cumulative volume, type of completion, mineral group, well direction, curves, maximum proppant concentration, hydraulic fracturing vendor, and mass. Some of this oilfield data may not be available in raw form. In such cases, an algorithm is applied to oilfield data in raw form to calculate the oilfield data of interest. For example, the average lateral inclination of a well may not be available in raw form. However, well survey points are generally available in raw form. Hence, by applying an algorithm that performs geometry calculations on the survey points, the average lateral inclination can be calculated. Similar calculations can be performed using the survey points to calculate lateral length. In this manner, oilfield data of interest can be made available by applying an algorithm to appropriate oilfield data in raw form.

Block 36 calls for providing a quality control check on the non-calculated oilfield data and the calculated oilfield data. The quality control check applies a routine or algorithm to the non-calculated oilfield data and the calculated oilfield data to determine if that data is reasonable or valid and, thus, acceptable for use. In one or more embodiments, the quality control check compares the non-calculated oilfield data and the calculated oilfield data to a threshold value or a range of acceptable values. Data that exceeds the threshold value (or is less than the threshold value depending on the type of data) or is outside the range of acceptable values does not pass the quality control check. The quality check may also include transforming values in terms of one unit into values in terms or another unit so that common units can be used for commonality. The quality check may also include checking the math based on provided values. Math that is incorrect may mean that the provided values are incorrect. The quality check may also include transforming trade names into generic names for commonality. The quality check may also include generating histograms and scatter plots to identify outliers. When observed values are a significant distance away (e.g., a number of standard deviations) from a majority of the values of the data (e.g., an average value), the outliers may be identified and sent to subject matter experts for further investigation. Block 37 calls for deleting any non-calculated oilfield data and/or any calculated oilfield data that does not pass the quality control check.

Block 38 calls for tagging any non-calculated oilfield data and/or any calculated oilfield data that passes the quality control check with one or more identifiers that are searchable. The one or more identifiers may be for at least one of an oilfield system, an apparatus in the system, a device in the apparatus, a component in the device, a performance value of the system, a performance value of the apparatus, a performance value of the device, a performance value of the component, a drilling parameter, a drilling performance value associated with using the drilling parameter, a formation stimulation parameter, a formation stimulation performance value associated with using the formation stimulation parameter, a production parameter, a production performance value associated with using the production parameter, a name of an earth formation of interest, a well in the earth formation of interest, a location of the earth formation of interest, and logging data for a well of interest. In general, identifiers enable a user to specify which type or types of data are requested so that the data can be quickly identified and retrieved by searching for the identifiers. Block 39 calls for storing any non-calculated oilfield data and/or any calculated oilfield data that passes the quality control check and associated one or more identifiers in a storage medium.

Block 40 calls for receiving a request for specified oilfield data from a user using a user interface. This block may include the user using the user interface to click through a hierarchy of oilfield data labels on the user interface using a mouse until a label for the specified oilfield data is attained and then clicking on the label to send the request for the specified oilfield data to the data center. Block 41 calls for searching identifiers in the storage medium to identify the specified oilfield data. Block 42 calls for sending the identified specified oilfield data from the non-calculated oilfield data, the calculated oilfield data, or some combination thereof stored in the storage medium to the user interface. This block may include displaying the specified oilfield data to a user using a display in the user interface.

Block 43 calls for planning an oilfield action using the specified oilfield data. Non-limiting embodiments of the oilfield action include drilling a borehole at a specified location (e.g., to provide efficient production), drill a borehole with a specified geometry or path (e.g., to provide efficient production) such as by using a downhole geo-steering system, drilling a borehole using a specified drilling fluid weight and/or flow rate (e.g., to prevent well from collapsing), placing packers at a specified location, hydraulically fracturing a formation with fracturing fluid at a specified pressure, injecting a specified proppant and/or amount of proppant into a fractured formation, and pumping hydrocarbons from the borehole at a specified flow rate where specified values and information are obtained from the oilfield data system. In one or more embodiments, planning may include analyzing multiple scenarios for a type of oilfield action and then selecting one scenario that provides an optimized benefit such as being most efficient or providing a certain level of production for minimum cost. Block 44 calls for implementing the oilfield action plan using oilfield equipment. Non-limiting embodiments of oilfield equipment are illustrated in FIG. 1. It can be appreciated that the searching, receiving requested oilfield data, determining, identifying, applying, providing, deleting, tagging, storing, receiving a request, searching, sending, and planning may be implemented by a processor.

Figure 4:
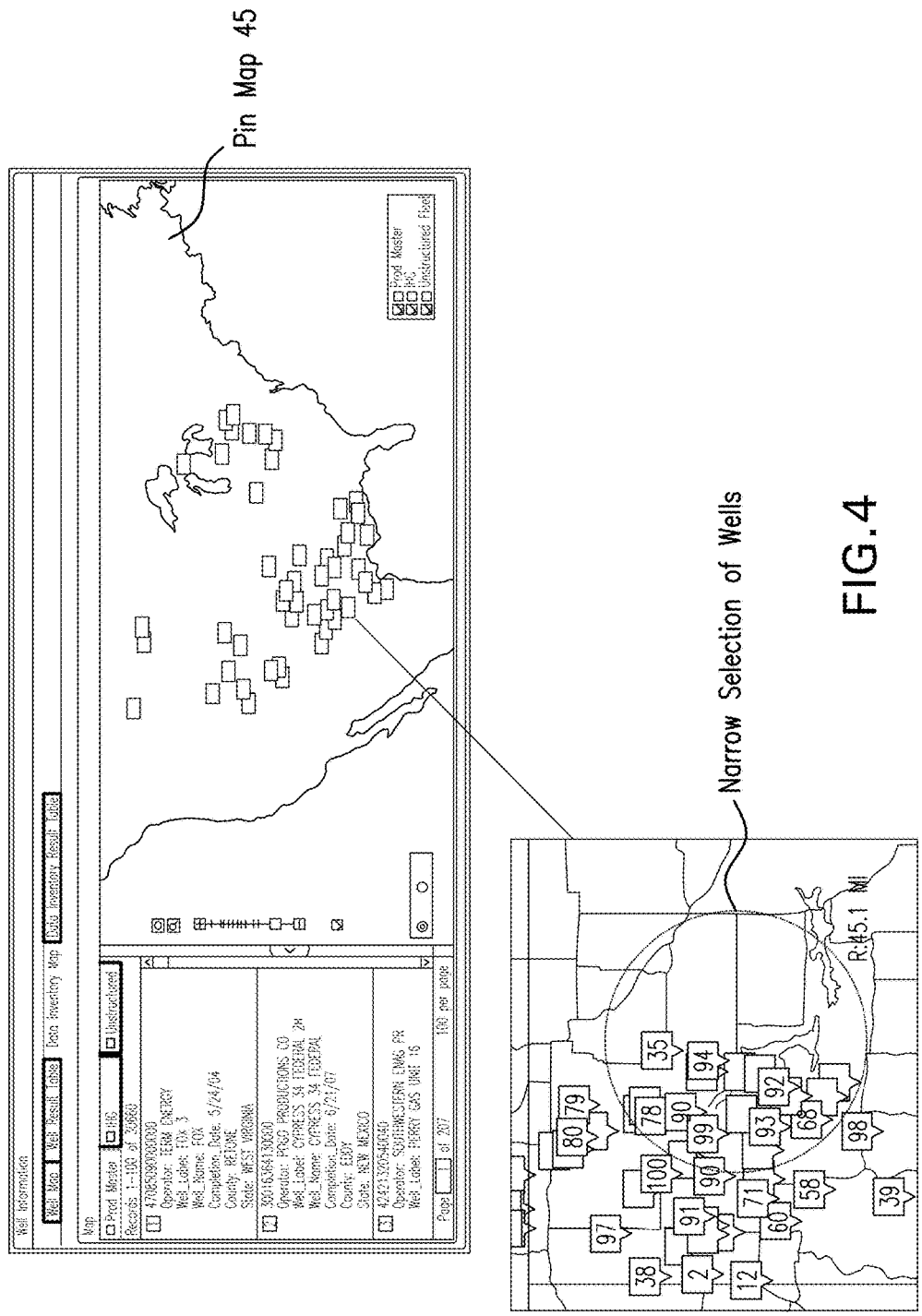
FIG. 4 depicts aspects of displaying oilfield data in a pin map.

As noted above, the method 30 may include displaying the specified oilfield data to a user using a display in the user interface. FIG. 4 depicts aspects of displaying oilfield data in a pin map. In the embodiment of FIG. 4, the specified oilfield data is displayed as a pin map 45. The pin map 45 includes a map itself, pins on the map having pin numbers (pin numbers shown in magnified view), and a record set. The record set refers to a menu set on the left-hand side of the map. Each number on the record set corresponds to a number of one of the pins on the map. Pin maps may also be used for selecting data. The pins on the map, which represent individual wells, open fly-out boxes when clicked. These fly-out boxes contain hyperlinks that narrow the search criteria to the specific value of the hyperlink when clicked. For example, if "Texas" is clicked on the fly-out box then search criteria will be narrowed to only include wells in Texas. The same applies to the wells listed on the scrolling record set menu to the left of the map. It is also possible to narrow down a selection of wells by using the radius area selection function. This is accomplished using a button in the upper left-hand corner featuring the icon of a circle. This button is used to initiate the selection process. To make a selection, click on this button and then select the point that will be center of the circle by clicking that point. Next, drag out the circle, guiding its size by reading the radius ("R: 45.1" in the example in FIG. 4). Upon releasing your mouse button, the wells within that radius will be selected.

Figure 5A:
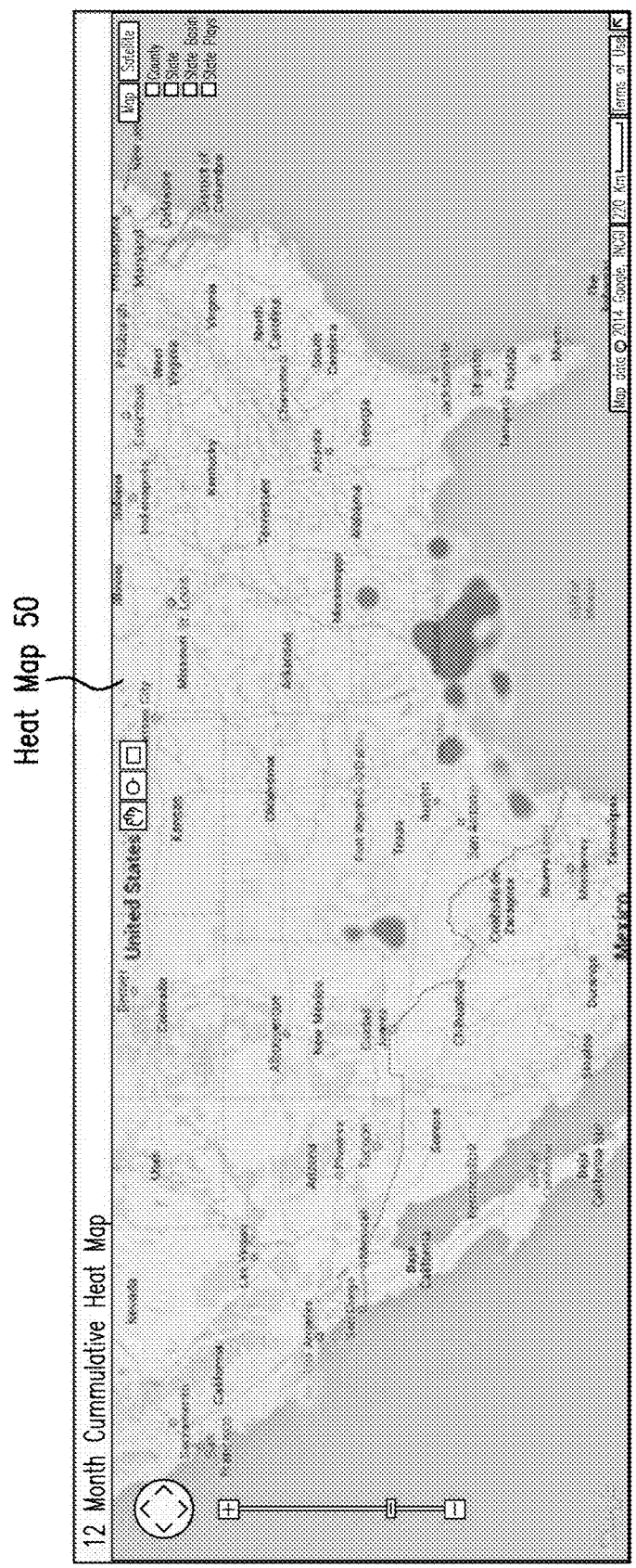
FIGS. 5A-5C, collectively referred to as FIG. 5, depict aspects of displaying oilfield data in a heat map.
Figure 5B:
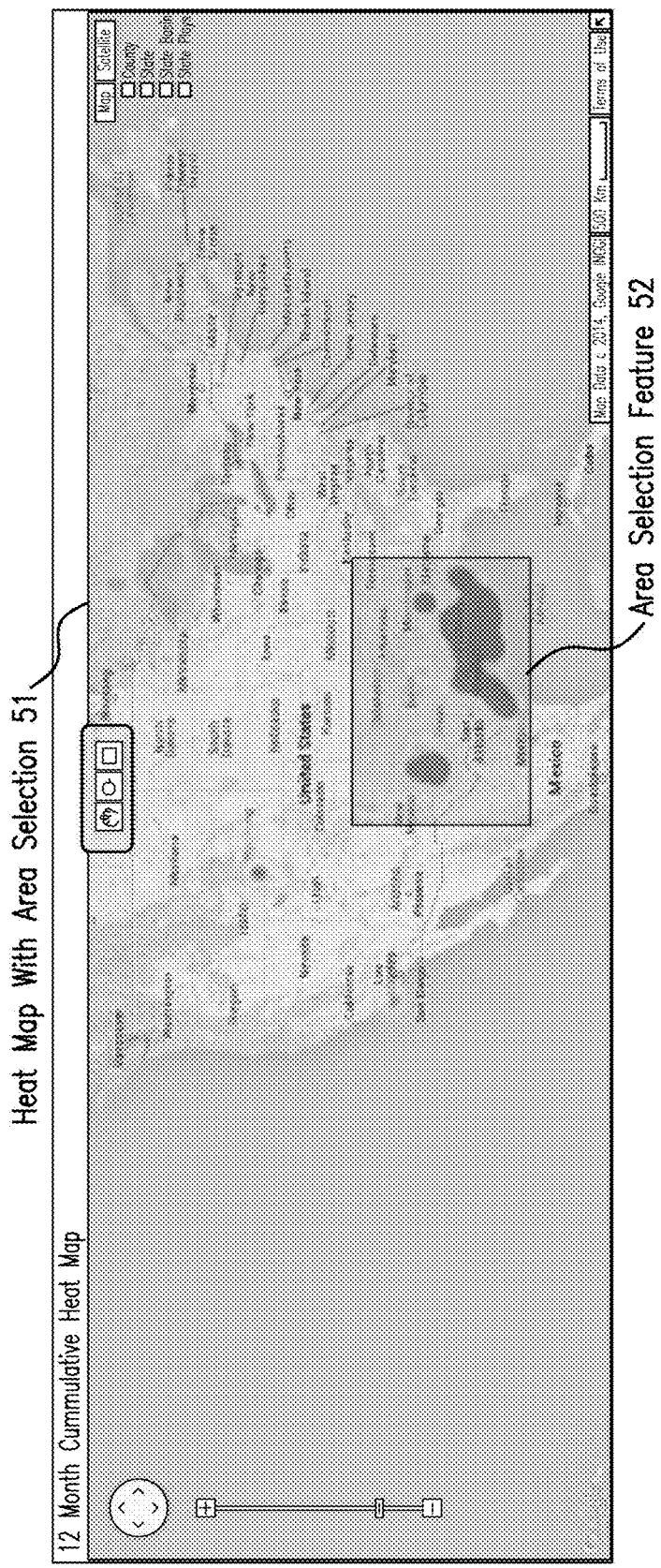
Figure 5C:
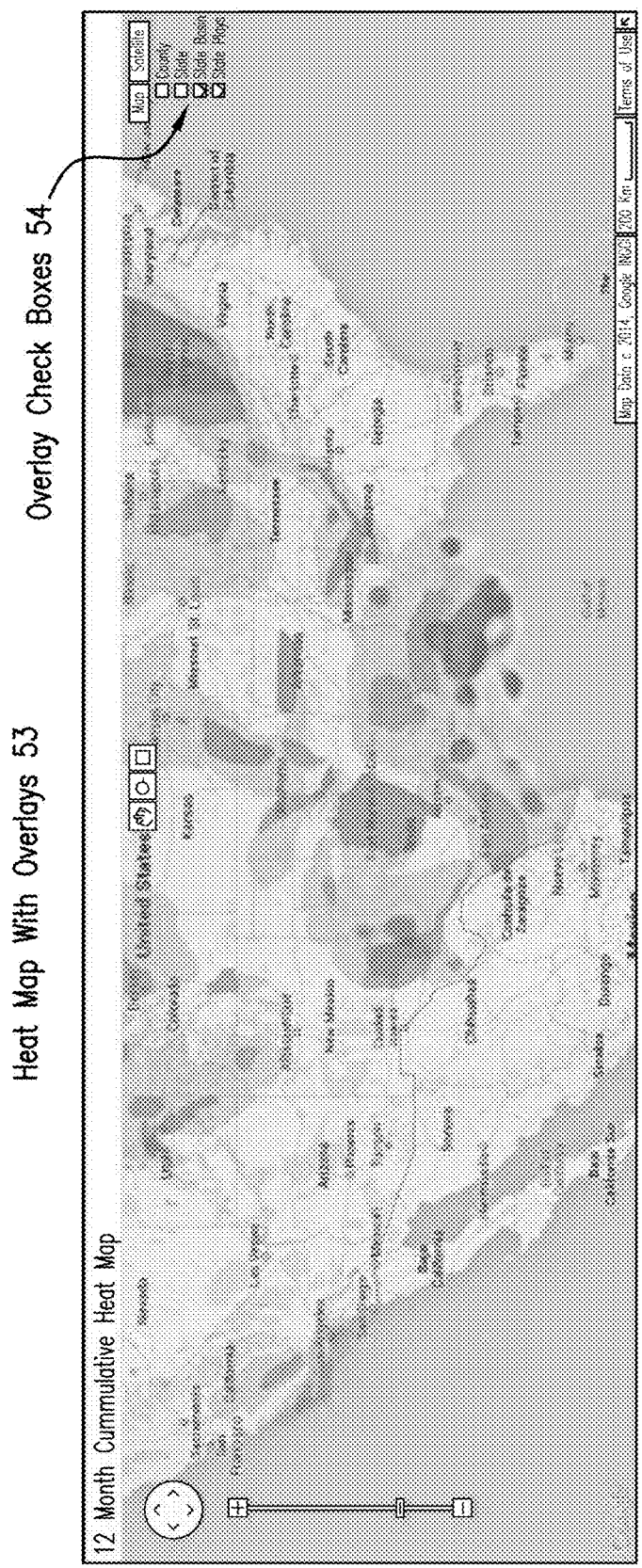

FIG. 5 depicts aspects of displaying oilfield data in a "heat" map. In the embodiment of FIG. 5A, a heat map 50 is displayed. The term "heat" refers to an image similar to an image illustrating heat, but in this case the heat relates to values or intensity of a parameter of interest such as hydrocarbon production. The heat map has many features such as both a radius and a rectangular area selection function, overlays, and a satellite view option. The heat map does not feature pins but rather coloring that represents the cumulative production of different areas represented on the map. The coloring indicates the level of production as compared to the rest of the selected area, with the top 20% of the wells showing up as red, and the next 30% showing up as yellow, and the other 50% showing up as green in a non-limiting embodiment. Zooming into the map using the zoom feature on the left-hand side causes the map to change the area covered without recalculating the relative production of the areas on the map. It is also possible to zoom into an area using either the radius or the rectangular area selection features as illustrated as a heat map with area selection 51 in FIG. 5B. Unlike the zoom feature using the scale on the left-hand side of the map, the rectangular and radius area selection will cause the overall recalculation of relative production volumes to include only those found within the selected area. The heat map also features overlays. Clicking the check boxes in the upper right-hand corner within heat map enables a user to view these overlays. Their purpose is to provide further visual context for the information being displayed on the map. If further overlays are needed, they can be requested for inclusion on the map. In the example in FIG. 5C, the Shale Basin and Shale Plays overlays are enabled because the corresponding check boxes are checked.

Figure 6A:
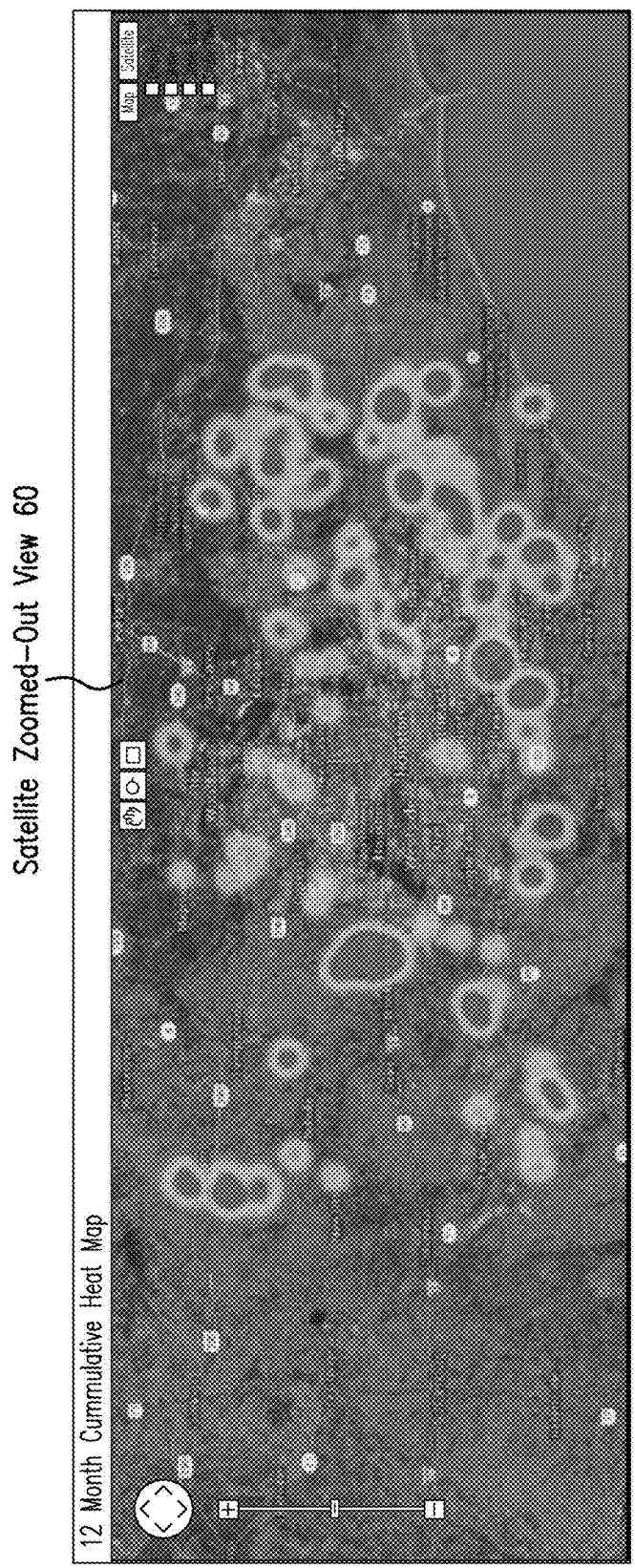
FIGS. 6A and 6B, collectively referred to as FIG. 6, depict aspects of displaying oilfield data in a satellite view.
Figure 6B:

The heat map may also be illustrated in a satellite view as illustrated in FIG. 6. The satellite view provides visual contest on the location of hydrocarbon production and a detailed view of the terrain on which producing wells are located. A zoomed-out view is illustrated in FIG. 6A while a zoomed-in view is illustrated in FIG. 6B. By using the satellite view and zooming in, it is possible to see the relative production levels of wells within a field. For example, note that the well on the left, in the left rectangle, has production data associated with it (denoted by heat dot) whereas the well on the right, in the right rectangle does not.

The specified oilfield data may also be illustrated in other ways. For example, the specified oilfield data may be displayed in bar charts, pie charts and scatter plots (not shown) in non-limiting embodiments.

In support of the teachings herein, various analysis components may be used, including a digital and/or an analog system. For example, the downhole electronics 11, the computer processing system 12, the downhole sensor 13, the drilling/production parameter controller 14, the geo-steering system 15, the formation stimulation system 18, the telemetry, the oilfield data system 20, the data center 21, the server 22, the storage medium 23, the firewall 24, the user interface 26, and/or the webcrawler 27 may include digital and/or analog systems. The system may have components such as a processor, storage media, memory, input, output, communications link (wired, wireless, pulsed mud, optical or other), user interfaces (e.g., display or printer), software programs, signal processors (digital or analog) and other such components (such as resistors, capacitors, inductors and others) to provide for operation and analyses of the apparatus and methods disclosed herein in any of several manners well-appreciated in the art. It is considered that these teachings may be, but need not be, implemented in conjunction with a set of computer executable instructions stored on a non-transitory computer readable medium, including memory (ROMs, RAMs), optical (CD-ROMs), or magnetic (disks, hard drives), or any other type that when executed causes a computer to implement the method of the present invention. These instructions may provide for equipment operation, control, data collection and analysis and other functions deemed relevant by a system designer, owner, user or other such personnel, in addition to the functions described in this disclosure.

Elements of the embodiments have been introduced with either the articles "a" or "an." The articles are intended to mean that there are one or more of the elements. The terms "including" and "having" are intended to be inclusive such that there may be additional elements other than the elements listed. The conjunction "or" when used with a list of at least two terms is intended to mean any term or combination of terms. The term "configured" relates to one or more structural limitations of a device that are required for the device to perform the function or operation for which the device is configured.

The flow diagrams depicted herein are just examples. There may be many variations to these diagrams or the steps (or operations) described therein without departing from the spirit of the invention. For instance, the steps may be performed in a differing order, or steps may be added, deleted or modified. All of these variations are considered a part of the claimed invention.

While one or more embodiments have been shown and described, modifications and substitutions may be made thereto without departing from the spirit and scope of the invention. Accordingly, it is to be understood that the present invention has been described by way of illustrations and not limitation.

It will be recognized that the various components or technologies may provide certain necessary or beneficial functionality or features. Accordingly, these functions and features as may be needed in support of the appended claims and variations thereof, are recognized as being inherently included as a part of the teachings herein and a part of the invention disclosed.

While the invention has been described with reference to exemplary embodiments, it will be understood that various changes may be made and equivalents may be substituted for elements thereof without departing from the scope of the invention. In addition, many modifications will be appreciated to adapt a particular instrument, situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A method for presenting oilfield data to a user, the method comprising:
   searching a plurality of oilfield data sources for oilfield data;
   receiving the oilfield data in raw form from the plurality of oilfield data sources;
   segregating the oilfield data in raw form into first oilfield data that requires application of an algorithm and second oilfield data that does not require application of the algorithm;
   identifying the first oilfield data as non-calculated oilfield data;
   applying the algorithm to the second oil field data to provide calculated oilfield data;
   providing a quality control check on the non-calculated oilfield data and the calculated oilfield data;
   deleting at least one of any non-calculated oilfield data and any calculated oilfield data that does not pass the quality control check;
   tagging at least one of any non-calculated oilfield data and any calculated oilfield data that passes the quality control check with one or more identifiers that are searchable;
   storing at least one of any non-calculated oilfield data and any calculated oilfield data that passes the quality control check and associated one or more identifiers in a storage medium;
   receiving a request for specified oilfield data from a user using a user interface;
   searching identifiers in the storage medium to identify the specified oilfield data;
   sending the identified specified oilfield data from the non-calculated oilfield data, the calculated oilfield data, or some combination thereof stored in the storage medium to the user interface;
   planning an oilfield action using the specified oilfield data; and
   implementing the planned oilfield action using oilfield equipment;
   wherein the searching, receiving requested oilfield data, segregating, identifying, applying, providing, deleting, tagging, storing, receiving a request, searching, sending, and planning are implemented by a processor.

2. The method according to claim 1, further comprising performing a statistical analysis on requested specified oilfield data.

3. The method according to claim 2, wherein the statistical analysis comprises at least one of an average value, a mean value, and a ranking according to a specified criterion.

4. The method according to claim 1, wherein the oilfield data sources comprise a subscription oilfield data source, a public oilfield data source, and a proprietary oilfield data source.

5. The method according to claim 1, wherein requesting oilfield data from a plurality of oilfield data sources and receiving requested oilfield data comprises using a webcrawler to automatically request and receive the oilfield data.

6. The method according to claim 1, wherein requesting oilfield data from a plurality of oilfield data sources and receiving requested oilfield data is automatically performed on a specified periodic basis.

7. The method according to claim 1, wherein segregating comprises identifying the oilfield data in raw form that meets a specified criterion for presentation to a user.

8. The method according to claim 7, wherein the non-calculated data and the calculated oilfield data meet the specified criterion for presentation to a user.

9. The method according to claim 1, wherein the quality control check comprises identifying values of at least one of non-calculated oilfield data and the calculated oilfield data that are within a specified range of values, exceeding a threshold value, not exceeding a threshold value, or some combination thereof.

10. The method according to claim 1, wherein the quality control check comprises transforming values into common units.

11. The method according to claim 1, wherein the quality control check comprises identifying outlier values that exceed a specified distance to an average value of data values.

12. The method according to claim 1, wherein the storage medium is in communication with a data center comprising a data server.

13. The method according to claim 1, wherein receiving a request for specified oilfield data from a user using a user interface comprises the user clicking through a hierarchy of oilfield data labels on the user interface using a mouse until a label for the specified oilfield data is attained and then clicking on the label to send the request for the specified oilfield data to the processor.

14. The method according to claim 1, wherein planning an oilfield action using the specified oilfield data comprises planning a hydraulic fracturing operation on an earth formation.

15. The method according to claim 14, wherein implementing the planned oilfield action using oilfield equipment comprises hydraulically fracturing an earth formation.

16. The method according to claim 1, wherein the one or more identifiers comprises identifiers for at least one of an oilfield system, an apparatus in the system, a device in the apparatus, a component in the device, a performance value of the system, a performance value of the apparatus, a performance value of the device, a performance value of the component, a drilling parameter, a drilling performance value associated with using the drilling parameter, a formation stimulation parameter, a formation stimulation performance value associated with using the formation stimulation parameter, a production parameter, a production performance value associated with using the production parameter, a name of an earth formation of interest, a well in the earth formation of interest, a location of the earth formation of interest, and logging data for a well of interest.

17. The method according to claim 16, wherein the formation stimulation parameter relates to a parameter used in hydraulic fracturing of the earth formation.

18. The method according to claim 1, wherein the oilfield data comprises an oilfield system, an apparatus in the system, a device in the apparatus, a component in the device, a performance value of the system, a performance value of the apparatus, a performance value of the device, a performance value of the component, a drilling parameter, a drilling performance value associated with using the drilling parameter, a formation stimulation parameter, a formation stimulation performance value associated with using the formation stimulation parameter, a production parameter, a production performance value associated with using the production parameter, a name of an earth formation of interest, a well in the earth formation of interest, a location of the earth formation of interest, and logging data for a well of interest.

19. The method according to claim 1, further comprising displaying the specified oilfield data to the user in a pin map, a heat map, and a satellite view map.

20. A non-transitory computer readable medium comprising computer executable instructions for presenting oilfield data to a user, the computer executable instructions when executed by a processor causing an apparatus to implement a method comprising:
  searching a plurality of oilfield data sources for oilfield data;
  receiving the oilfield data in raw form from the plurality of oilfield data sources;
  segregating the oilfield data in raw form into first oilfield data that requires application of an algorithm and second oilfield data that does not require application of the algorithm;
  identifying the first oilfield data as non-calculated oilfield data;
  applying the algorithm to the second oilfield data to provide calculated oilfield data;
  providing a quality control check on the non-calculated oilfield data and the calculated oilfield data;
  deleting at least one of any non-calculated oilfield data and any calculated oilfield data that does not pass the quality control check;
  tagging at least one of any non-calculated oilfield data and any calculated oilfield data that passes the quality control check with one or more identifiers that are searchable;
  storing at least one of any non-calculated oilfield data and any calculated oilfield data that passes the quality control check and associated one or more identifiers in a storage medium;
  receiving a request for specified oilfield data from a user using a user interface;
  searching identifiers in the storage medium to identify the specified oilfield data;
  sending the identified specified oilfield data from the non-calculated oilfield data, the calculated oilfield data, or some combination thereof stored in the storage medium to the user interface;
  planning an oilfield action using the specified oilfield data; and
  implementing the planned oilfield action using oilfield equipment.

* * * * *